March 27, 1956 C. G. KEPPLE 2,739,881
THERMOSET SYNTHETIC RESIN LAMINATE WITH SPECIAL
SURFACE AND METHOD OF MAKING SAME
Filed June 19, 1953

United States Patent Office 2,739,881
Patented Mar. 27, 1956

2,739,881

THERMOSET SYNTHETIC RESIN LAMINATE WITH SPECIAL SURFACE AND METHOD OF MAKING SAME

Charles G. Kepple, Pittsburgh, Pa., assignor to Westinghouse Electric Corporation, East Pittsburgh, Pa., a corporation of Pennsylvania Application June 19, 1953, Serial No. 362,937

15 Claims. (Cl. 41—42)

This invention relates to a thermosetting synthetic resinous laminate having a novel roughened surface and a process for preparing the same.

The laminate of this invention is particularly suited for use as a base for "printed" electrical circuits. A printed circuit comprises a conducting pattern disposed on the surface of an insulating material, which serves to conduct electrical current between electrical components, replacing to a large extent the internal mass of wires, and even some components such as resistors, normally found in a conveniently assembled chassis. Circuits are defined as being "printed" when a conducting material, usually a metal coating, is applied in a desired pattern on an insulating surface by a suitable process.

In the use of printed electrical circuits a serious problem has arisen with respect to adequate adherence of the conducting material to the base laminate. Due to the different physical and chemical natures of the conductive metals and insulating non-metallic laminate, there is little "natural" adhesion between the two. For this reason, it is desirable to provide a properly prepared surface on the base laminate both to increase surface area and to provide mechanical interlocking of a subsequently applied layer of metal or other conductor.

Numerous attempts to provide a surface to which the conducting material will properly adhere have not proven completely satisfactory. For example, sand blasting and shot blasting produce a surface of roughened texture having a series of indentations, but the indentations so formed have either generally smooth, inwardly converging plane surfaces, or smooth concavities. Even with extensive treatment of the surface by such abrading techniques, the adherence of the conducting material to the base laminate is poor, there being no means with which the conducting material may effectively interlock or wedge itself. Thus, subsequently applied layers of metal can be readily peeled off, or they blister or lift due to thermal effects.

An object of this invention is to provide a resinous laminated body having a novel roughened surface texture comprising a multiplicity of finely divided granular particles imbedded in a surface of the laminated body with outer portions of the particles being exposed.

A further object of this invention is to provide a process of making a resinous laminated body suitable for use as a base for printed electrical circuits by imbedding finely divided granular particles in the surface of the laminated body to provide a surface of roughened texture on which an electrically conducting material will readily adhere and will be held in an interlocking relation.

Another object of this invention is to provide a resinous laminated body with an electrically conductive coating material on a surface of the laminated body, the coating material adhering to the laminated body by encompassing exposed portions of finely divided granular particles imbedded in the laminated body and forming a mechanical bond therewith.

A still further object of this invention is to provide a resinous laminated body with a printed electrical circuit thereon, the circuit being produced by etching away selected portions of an electrically conducting coating material mechanically bonded to the laminated body by means of finely divided granular particles imbedded therein.

Another object of this invention is to provide a resinous laminated body with a printed electrical circuit thereon, the circuit being produced by applying to the laminate a mask having selected portions cut therefrom to conform with a desired electrical circuit, and then mechanically bonding a conducting material to the laminate through the cut away portions of the mask.

Other objects of the invention will in part be obvious and will in part appear hereinafter.

For a better understanding of the nature and objects of the invention, reference should be had to the following detailed description and drawing, in which.

Figure 1:
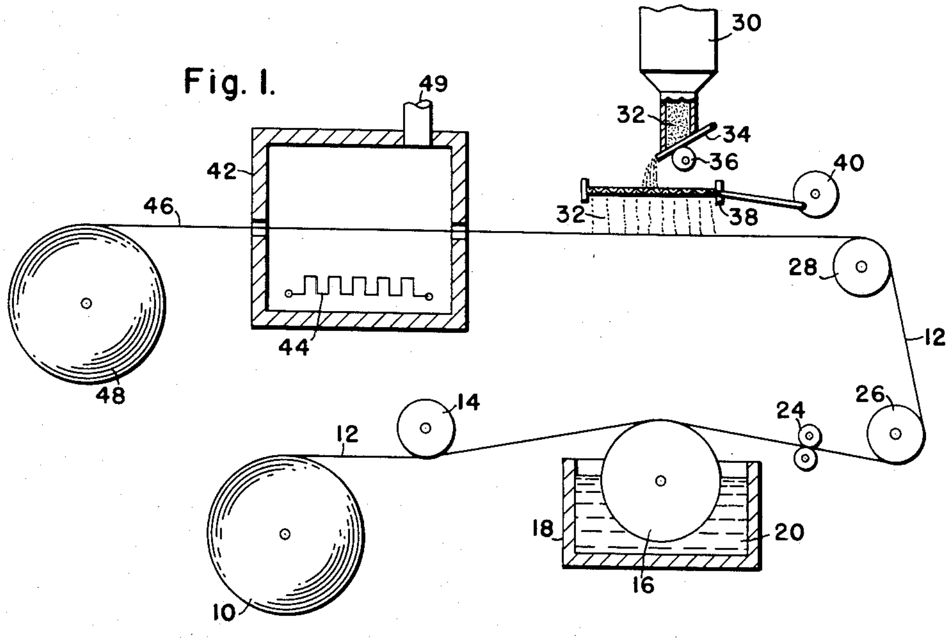
Figure 1 is a schematic view of apparatus for applying adhesive resin varnish to the surface of a sheet fibrous material previously impregnated with a laminating varnish advanced to the B stage, applying finely divided granular particles to the wet adhesive varnish, and drying the sheet to a tack-free condition.

We have discovered procedures and materials by the use of which a roughened surface comprising a multiplicity of finely divided granular particles imbedded in a thermoset synthetic resinous laminate may be produced, thereby providing a surface of roughened texture to which an electrically conductive coating material, such as a film or layer of metal, will readily adhere and interlock. Briefly, the process comprises partially imbedding in the surface of a resinous laminate during the molding operation, a layer of a finely divided, sharp angled granular material that is sufficiently hard to withstand molding pressures and relatively insoluble in water and selected electrolytes to be used in plating the laminate, the particles of granular material being partly imbedded in the resin and partly projecting from the final laminate.

The process of partially imbedding the granular material in the laminate is accomplished by applying a thin film of an adhesive resin by any suitable means such as rolling or spraying to the outermost surface of a fibrous sheet previously impregnated with a phenolic resin advanced well into the B stage. While the adhesive resin is still wet, a layer of the finely divided sharp-angled granular particles is distributed on the adhesive film so that the particles adhere thereto. The amount and size of granular particles used will depend upon the particular surface desired. The sheet with its wet adhesive film and applied granular particles is passed through an oven to dry the sheet to a tack-free condition. This prepared sheet is then cut to size and used as a top surface sheet of a stack of resin impregnated sheets to be molded into a laminated body. The laminated body is molded in such a manner that a small upper portion of each of the granular particles remains exposed after the molding operation. This is accomplished by controlling the degree of flow of the resin during the molding operation as will be hereinafter described.

Particularly suitable materials for imbedding in a surface sheet of the laminate are those relatively insoluble in water and selected electrolytes to be used in plating the laminate and resistant of crushing. Examples of suitable materials are calcium carbonate or marble, magnesium carbonate, dolomite, and granulated metals such as iron, aluminum, copper, gold, silver, tin, and nickel.

The adhesive resin used to hold the granular particles on the top surface sheet prior to molding the laminated body must have special properties. The resin must retain sufficient tack when exposed to air for a period of time of up to half an hour or more to provide proper adhesion of the particles. If the applied resin varnish forms a semi-gelled surface the particles will not adhere properly thereto. Also, the varnish must have a consistency such that it can be applied as a very thin continuous film. The particles must adhere to this film, and partly enter into it, but not be covered thereby. Furthermore, the resin must have an extended B stage so that it may be dried to a very low volatile content in the drying oven without appreciably converting into the C stage. It must maintain moldability with practically zero flow, that is, have very low greenness so that it does not cover the particles during the molding operation.

The following novel phenolic resin has the above-mentioned properties whereby it is unusually well suited for use as the adhesive varnish. This phenolic resin comprises the reaction product of a mixture of from 75% to 25% by weight of phenol, and from 25% to 75% by weight of a phenol selected from at least one of the groups consisting of cresol and cresylic acid, from 5% to 20% by weight based on the total weight of the phenols, of one or more thermoplastic rosin esters, and from 1 to 2 moles of an aldehyde per mole of the phenols. The aldehyde is selected from the group consisting of formaldehyde and polymers of formaldehyde and compounds engendering aldehyde, such as hexamethylene tetramine, and mixtures of two or more. The solvent for the resulting resin is n-butyl alcohol or a similar alcohol, alone or admixed with toluene or other solvent boiling in the range of from 100° C. to 135° C. A number of thermoplastic rosin esters may be used, such as glycol or glycerol esters of rosins, and methyl esters of abietic acid such as methyl abietate and methyl hydrogen abietate.

The resin is prepared by charging phenol, aldehyde and ½% by weight of ammonia (28% aqueous solution) as a catalyst into a reaction vessel equipped with a mechanical stirrer, thermometer and a reflux condenser. The reaction vessel is heated to bring the contents to a boiling temperature and then refluxed for 30 minutes. The rosin ester and cresylic acid are then added, and the mixture is refluxed for an additional hour. This reaction product is treated under vacuum of 22 to 24 inches of mercury with heat applied until the temperature rises to 100° C. to 110° C., at which time the solvent is added in an amount to produce about a 50% resin solids solution and the resinous varnish is allowed to cool.

It is to be understood that other adhesive resins may be used provided they have the above mentioned desirable properties and are compatible with other impregnating resins used.

The amount of this adhesive resin varnish applied to form a film on a sheet previously impregnated with a suitable phenolic resin and cured to the B stage is varied according to the particle size and amount of particles required for the particular surface desired. For example, with dolomite, of a particle size of from 180 to 240 mesh generally requires ½ pound to ¾ pound of the resin (solvent free) per ream having 4½ to 5 pounds of the dolomite particles. For finer dolomite particles of from 240 mesh and to 320 mesh, substantially ½ pound of adhesive resin is used for each 2½ pounds to 3 pounds of the particles.

A ream is defined as the area of a sheet having a width of 37 inches and a length of 33 yards.

In order that the flow of resin may be controlled during the molding operation so that the granular particles are not covered, the degree of advancement of the previously applied B stage phenolic resin in the surface sheet is stopped at a predetermined point. This point is determined by a "volatility control" method. A satisfactory means for determining the degree of advancement of the resin by the volatility control method is to weigh a sample of the varnish impregnated sheet to the nearest one hundredth of a gram, place the weighed sample in an oven at a temperature of 100° C. for 15 minutes and determine the weight loss, then divide the weight loss by the original weight of the sheet and multiply by 100 to calculate the per cent weight loss, or per cent volatile loss.

For optimum results, it has been found that the impregnated material used for the surface sheet should have a per cent volatile of not more than 0.8% as determined by this volatility control method so that there will not be excessive resin flow during the molding operation. It is desirable to have as low a per cent volatile as possible, but difficulties arise with the material becoming so brittle that cracks due to handling would be a problem. Enough flexibility must be maintained to facilitate ease in handling.

Referring to Fig. 1 of the drawing, a roll 10 of sheet fibrous material 12 previously impregnated to a resin ratio of from 1.65 to 1.85 with a suitable phenolic resin dried to a tack-free B stage condition, is passed under a tension roller 14 and over a film applying roller 16 disposed within a resin varnish tank 18 filled with an adhesive resin varnish 20 in the low polymeric or A stage. A wet adhesive resin coating 22 is thereby applied to one side of the sheet 12. The sheet 12 is then passed between squeeze rollers 24 to control the amount of adhesive resin coating 22 applied to the sheet. Without removing the solvent from the coating 22, the sheet 12 is then passed over guide rollers 26 and 28 and under a hopper 30 containing a supply of finely divided granular particles 32. The hopper 30 is provided with a discharge means comprising a pivoted gate member 34 actuated by a rotating accentric 36 whereby a continuous stream of finely divided granular particles is deposited on a vibrating screen 38 actuated by eccentric 40. The purpose of the vibrating screen is to provide an even distribution of particles on the wet adhesive coating and to retain any oversize particles. The sheet 12 with its wet adhesive resin coating 22 and applied particles 32 thereon, then passes into a drying oven 42 provided with a suitable heating means such as an electrical resistance element 44. In the oven 42 the coated sheet material is dried at a predetermined temperature sufficient to dry the adhesive resin coating and advance it well into the B stage so as to prevent excessive resin flow during the molding operation. The finely divided granular particles 32 will adhere to the dried adhesive resin coating 22 on the surface of the resulting dried surface sheet 46 and may be wound into a roll 48 to await future use.

The oven 42 is provided with a stack 49 for the escape of vapors. If conditions require, a ventilating fan of any well known type (not shown), may be mounted in the stack.

It is to be understood that other suitable means for distributing the uniform layer of granular particles on the wet adhesive film may be utilized. For example, the particles may be conveyed by means of a belt to a position adjacent the adhesive covered sheet and transferred thereto by an electrostatic charge conducted to the sheet.

Figure 2:
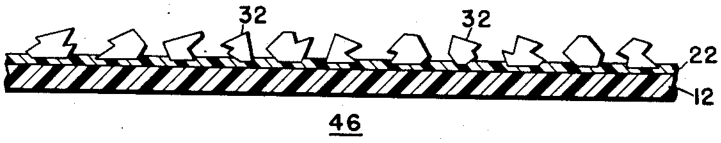
Fig. 2 is a magnified fragmentary transverse sectional view of a fibrous surface sheet impregnated with a resinous laminating varnish, an adhesive resin varnish on the surface thereof, and finely divided granular particles held to the surface of the sheet by means of the adhesive varnish.
Figure 3:
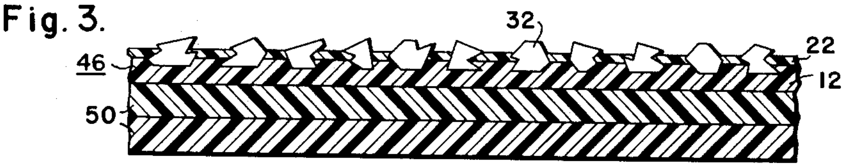
Fig. 3 is a magnified fragmentary transverse sectional view of a portion of a laminate showing the fibrous surface sheet having been advanced to final C stage under heat and pressure illustrating the granular particles imbedded in the sheet.

In molding a laminated body in accordance with this invention, the prepared sheet 46 with the applied coating 22 and the particles 32 adhering thereto, as illustrated in Fig. 2 of the drawing, is taken from roll 48 and cut to a predetermined size. This prepared sheet is placed with its particle covered surface uppermost on a stack of resin impregnated sheets of the same size not covered with granular particles, the stack to be laminated into a cured unitary body. The stack to be molded comprises a plurality of body sheets impregnated with phenolic resin advanced into the B stage and a treated top sheet 46 provided with a layer of granular particles 32 as hereinbefore described. It will be understood that in making laminates, the treated sheet 46 may be applied to both the top and bottom surfaces of the stack with the particles 32 being exposed at both surfaces. The assembled stack is then molded under heat and pressure and brought to the final C stage whereby particles 32 are imbedded, with outer portions extending from the surface sheet 46 which is bonded to body sheets 50 as illustrated in Fig. 3 of the drawing.

The body sheets 50 making up the laminated body may be impregnated with any suitable thermosettable resinous varnish, depending upon the type of service to which the laminate will be subjected, including temperature requirements. Paper, cloth, asbestos, and glass fiber sheets impregnated with phenolics, epoxy resins, melamine resins, silicone resins, etc. may be employed. Good results have been obtained, however, using a varnish composed of a thermosettable phenolaldehyde resin. The body sheets were impregnated with the resin to a resin ratio of 2.00 to 2.50.

Resin ratio is defined as the weight of the sheet plus the weight of the resin applied to it, to the weight of the untreated sheet.

Figure 4:
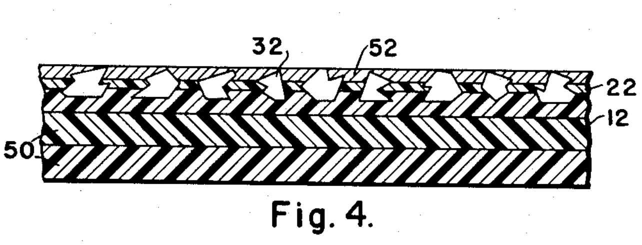
Fig. 4 is a magnified fragmentary transverse sectional view of a laminate showing the fibrous surface sheet with electrically conducting material encompassing the exposed portions of the particles imbedded in the sheet.

The exposed portions of particles 32 provide a surface of roughened texture on which a subsequently applied coating 52 will readily adhere and interlock as shown in Fig. 4 of the drawings. The coating 52 during its application flows around the particles 32 and completely encompasses them such that a mechanical bond or interlock is formed therewith.

A coating 52 of an electrically conducting material may be applied to the roughened surface on the laminate by any of the well-known methods such as painting, spraying, immersion, chemical deposition, and electroplating. The coating 52 may cover the entire upper surface of the laminate, or both upper and lower surfaces, or it may be applied in a selected pattern. A desired electrical circuit composed of the electrically conducting material may be produced by treating a complete surface coating 52 on the laminate by any number of well-known methods used to produce a pattern. Among such methods, etching appears to have the widest range of applications. An etched circuit is produced by printing a pattern on the coating 52 of the electrically conducting material of the laminate with acid resistant inks, paints or enamels. The unwanted metal not protected by the printed pattern is then etched away with an acid or other reagent. The patterns may be applied by any of several well-known printing processes of which photography, silk screening, and offset printing are a few.

The following example is exemplary of the practice of the invention.

*Example*

An adhesive phenolic resin was prepared by reacting the following ingredients as previously set forth:

| | Parts by weight |
|---|---|
| Phenol | 450 |
| Cresol | 150 |
| Aqua ammonia 26° Bé | 9 |
| Formalin—37% | 520 |
| Methyl abietate | 60 |

The reaction product was dissolved in 320 parts by weight of butyl alcohol.

One-half pound per ream of this adhesive resin varnish was utilized to cover the surface of a fibrous sheet impregnated with a phenolic resin dried to a tack-free, B stage condition. On the adhesive resin film there was evently distributed 4½ pounds per ream of 180 to 240 mesh dolomite. This particle covered sheet was passed through a drying oven and the resin advanced to a degree of 0.8% volatile condition. The prepared sheet was then cut to a predetermined size and placed at the top of a stack of body sheets impregnated to a resin ratio of approximately 2.0 with a phenol-aldehyde resin advanced well into the B stage and also cut to the same predetermined size. The stack was molded in a press at a pressure of approximately 1000 p. s. i. and a temperature of 160° C. for 45 minutes.

During the molding operation, the resin flowed around the particles, imbedding them in the body of the laminate, but leaving the top portions of the particles exposed. The laminated body was given a strike of silver on its roughened surface by flesh immersion coating in a silvering solution to provide a conducting surface on which copper coating 52 was plated from a standard alkali cyanide copper plating solution. The copper 52 was plated to a thickness of 0.002" so as to completely encompass the imbedded dolomite particles in the laminate as illustrated in Fig. 4 of the drawing.

Figure 5:
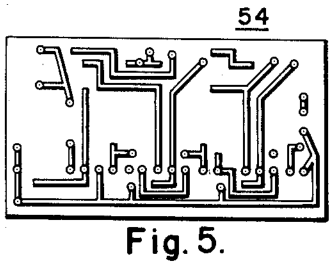
Fig. 5 is a top plan view of a laminated body having an electrical circuit printed thereon.

A conducting pattern 54 was produced on the laminate body as illustrated in Fig. 5 of the drawing, by protecting the desired conducting areas with an acid resistant ink and etching away the undesired metal.

Good results have also been obtained by depositing a conducting pattern of silver through a stenciled mask on the laminate, and then plating copper on the applied silver strike pattern.

Since certain changes may be made in the above invention and different embodiments of the invention may be made without departing from the scope thereof, it is intended that all matter contained in the above description or taken in connection with the accompanying drawing shall be interpreted as illustrative and not in a limiting sense.

I claim as my invention:

1. In the process of making a molded thermoset resinous laminated body having a roughened surface thereon, the steps comprising impregnating a sheet which is to form a surface sheet of the laminated body with a synthetic resin varnish in the A stage and drying the sheet to a tack-free condition, applying a thin coating of adhesive resin to a surface of the resin impregnated sheet, distributing on the adhesive film a uniform layer of finely divided granular particles that are sufficiently hard to withstand molding pressures and relatively insoluble in water and selected electrolytes to be used in plating the laminate, the adhesive resin being wet due to solvent being present and in the A stage at the time of application of said granular particles, drying the sheet to evaporate the solvent from the adhesive resin and advance the adhesive resin to a point in the B stage whereby the resins will subsequently only partially surround the granular particles during the molding operation, positioning the particle covered B stage sheet with its particle covered surface facing outwardly on a stack of resin impregnated sheets to be laminated, subjecting the assembled sheets to heat and pressure to form a cured laminate such that the particles are permanently imbedded in the surface of the molded laminate with the outer portions of the particles being exposed, and thereafter depositing upon the exposed portions of the imbedded particles a coating of an electrically conducting metal, the electrically conducting metal encompassing the exposed portions of the particles imbedded in the laminated body thereby forming a mechanical bond therewith.

2. The process of claim 1 in which the finely divided granular particles are selected from at least one of the group of metals consisting of iron, aluminum, copper, gold, silver, tin, and nickel.

3. The process of claim 1 in which the finely divided granular particles are selected from at least one of the group consisting of calcium carbonate, magnesium carbonate, marble, and dolomite.

4. The process of claim 1 in which the adhesive resin is a phenolic resin comprising a mixture of from 75% to 25% by weight of phenol, and from 25% to 75% by weight of a phenol selected from at least one of the group consisting of cresol and cresylic acid, from 5% to 20% by weight, based on the total weight of the phenols, of at least one thermoplastic rosin ester, and from 1 to 2 moles of an aldehyde per mole of the phenols, the aldehyde being selected from the group consisting of formaldehyde, polymers of formaldehyde, and compounds engendering formaldehyde.

5. An article of manufacture produced in accordance with the process of claim 1.

6. An article of manufacture produced in accordance with the process of claim 2.

7. An article of manufacture produced in accordance with the process of claim 3.

8. An article of manufacture produced in accordance with the process of claim 4.

9. In a resinous laminated body suitable for use as a base for printed electrical circuits, the body having a surface sheet impregnated with a synthetic resin to a resin ratio of 1.65 to 1.85, a thin coating of adhesive resin on the outer surface of the surface sheet, a multiplicity of hard granular particles permanently embedded in the surface of the molded laminate with outer portions of the particles being exposed therefrom, and an electrically conducting coating metal deposited on the exposed portions of the particles, the electrically conducting metal encompassing the exposed portions of the particles in the laminated body thereby forming a mechanical bond therewith.

10. The laminated body of claim 9 in which the granular particles are selected from at least one of the group consisting of calcium carbonate, magnesium carbonate, marble, and dolomite.

11. The laminated body of claim 9 in which the granular particles are selected from at least one of the group consisting of iron, aluminum, copper, gold, silver, tin, and nickel.

12. The laminated body of claim 9 in which the adhesive resin is a phenolic resin comprising a mixture of from 75% to 25% by weight of phenol, and from 25% to 75% by weight of a phenol selected from at least one of the group consisting of cresol and cresylic acid, from 5% to 20% by weight, based on the total weight of the phenols, of at least one thermoplastic rosin ester and from 1 to 2 moles of an aldehyde per mole of the phenols, the aldehyde being selected from the group consisting of formaldehyde polymers of formaldehyde and compounds engendering formaldehyde.

13. The laminated body of claim 9 in which selected portions of the electrically conducting metal are etched from the laminated body to produce an electrical printed circuit adapted for use in electronic systems.

14. The laminated body of claim 9 in which the electrically conducting metal is deposited on the laminated body in a predetermined pattern by being passed through a stenciled mask.

15. A resinous laminated body having a roughened surface to which a coating of electrically conducting metal will readily adhere comprising a surface sheet impregnated with a synthetic resin to a resin ratio of 1.65 to 1.85, a thin coating of adhesive resin on the outer surface sheet, and a multiplicity of hard granular particles permanently embedded in the surface of the molded laminate whereby the outer portions of the particles are exposed to engage a subsequently applied coating of electrically conducting metal and mechanically bond said coating to the laminated body.

References Cited in the file of this patent

UNITED STATES PATENTS 2,663,663 Weltman et al. ---------- Dec. 22, 1953